United States Patent
Sung et al.

(10) Patent No.: US 11,081,668 B2
(45) Date of Patent: Aug. 3, 2021

(54) DISPLAY DEVICE

(71) Applicant: Samsung Display Co., Ltd., Yongin-Si (KR)

(72) Inventors: Wooyong Sung, Yongin-si (KR);
Hyoungsub Lee, Yongin-si (KR);
Moonwon Chang, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/575,163

(22) Filed: Sep. 18, 2019

(65) Prior Publication Data
US 2020/0235333 A1    Jul. 23, 2020

(30) Foreign Application Priority Data

Jan. 21, 2019 (KR) .................. 10-2019-0007576

(51) Int. Cl.
*H01L 51/52* (2006.01)
*H01L 27/32* (2006.01)

(52) U.S. Cl.
CPC ...... *H01L 51/5253* (2013.01); *H01L 27/3258* (2013.01)

(58) Field of Classification Search
None
See application file for complete search history.

(56) References Cited

U.S. PATENT DOCUMENTS

| 9,997,738 | B2 | 6/2018 | Choi et al. |
| 10,108,149 | B2 | 10/2018 | Kang et al. |
| 10,128,461 | B2 | 11/2018 | Kang et al. |
| 10,186,191 | B2 | 1/2019 | Kang et al. |
| 10,205,122 | B2 | 2/2019 | Choi et al. |
| 10,230,069 | B2 | 3/2019 | Choi et al. |
| 2017/0150618 | A1 | 5/2017 | Choi et al. |
| 2017/0162637 | A1 | 6/2017 | Choi et al. |
| 2017/0288004 | A1* | 10/2017 | Kim ............... H01L 27/3276 |
| 2018/0069063 | A1 | 3/2018 | Kim et al. |
| 2018/0151834 | A1 | 5/2018 | Kanaya |
| 2018/0183015 | A1 | 6/2018 | Yun et al. |
| 2018/0351126 | A1* | 12/2018 | Choi ............... H01L 51/5284 |
| 2019/0051859 | A1* | 2/2019 | Choi ............... H01L 51/0097 |
| 2019/0326553 | A1* | 10/2019 | Abe ............... H01L 27/3258 |
| 2020/0106046 | A1* | 4/2020 | Kim ............... H01L 27/326 |

FOREIGN PATENT DOCUMENTS

| EP | 3486962 A2 | 5/2019 |
| EP | 3660917 A1 | 6/2020 |
| KR | 10-2015-0071642 A | 6/2015 |
| KR | 10-2016-0147116 A | 12/2016 |
| KR | 10-2017-0019553 A | 2/2017 |
| KR | 10-2017-0059527 A | 5/2017 |
| KR | 10-2017-0059537 A | 5/2017 |

(Continued)

*Primary Examiner* — Nilufa Rahim
(74) *Attorney, Agent, or Firm* — Innovation Counsel LLP (57) ABSTRACT

A display device includes a substrate including a display area, a first non-display area surrounding the display area, and a second non-display area surrounded by the display area, a through portion disposed in the second non-display area, the substrate in the through portion being removed, and a first groove disposed in the second non-display area in the substrate to surround the through portion.

20 Claims, 8 Drawing Sheets

(56) References Cited

FOREIGN PATENT DOCUMENTS

| KR | 10-2017-0059864 A | 5/2017 |
| KR | 10-2017-0065059 A | 6/2017 |
| KR | 10-2017-0066767 A | 6/2017 |
| KR | 10-2017-0095444 A | 8/2017 |
| KR | 10-2018-0026599 A | 3/2018 |
| KR | 10-2018-0076429 A | 7/2018 |

* cited by examiner

DISPLAY DEVICE

CROSS-REFERENCE TO RELATED APPLICATION

This application claims the benefit of Korean Patent Application No. 10-2019-0007576, filed on Jan. 21, 2019, in the Korean Intellectual Property Office, the disclosure of which is incorporated herein in its entirety by reference.

BACKGROUND

1. Field

One or more embodiments relate to a display device.

2. Description of the Related Art

The recent trend in display devices is that physical buttons on a front surface of a display device are eliminated, and a display area displaying images is extended. For example, display devices in which a camera is placed in a display area to broaden the display area have been introduced. To place an additional member such as a camera in the display area, a groove or a through portion in which the additional member may be located in the display area is formed. However, the groove or the through portion formed in the display area may act as a new permeation path through which moisture from the outside penetrates into the display area.

SUMMARY

One or more embodiments include a display device in which penetration of moisture from the outside through a through portion in a display area is prevented.

Additional aspects will be set forth in part in the description which follows and, in part, will be apparent from the description, or may be learned by practice of the presented embodiments.

According to one or more embodiments, a display device includes: a substrate comprising a display area, a first non-display area surrounding the display area, and a second non-display area surrounded by the display area; a through portion disposed in the second non-display area, the substrate in the through portion being removed; and a first groove disposed in the second non-display area in the substrate to surround the through portion.

The substrate may include a first base layer, a first barrier layer, a second base layer and a second barrier layer that are sequentially disposed, the first groove extends from the second barrier layer to at least a portion of the second base layer in a depth direction of the substrate, the second barrier layer comprises a pair of first tips that are disposed on undercut portions formed in the second base layer in a cross-sectional view, and a reinforcement layer and an inorganic barrier layer are sequentially disposed on the pair of first tips.

The inorganic barrier layer may completely cover an exposed surface of the first groove.

The inorganic barrier layer on the bottom of the first groove may directly contact the first barrier layer.

The reinforcement layer and the inorganic barrier layer may be disposed in a region corresponding to the second non-display area.

The display device may further include a second groove that is between the first groove and the through portion and surrounds the through portion, and the second barrier layer comprises a pair of second tips that are disposed on the undercut portions formed in the second base layer in a cross-sectional view, and the reinforcement layer and the inorganic barrier layer are sequentially disposed on the pair of second tips.

The inorganic barrier layer may completely cover an exposed surface of the second groove.

The display device may further include: a thin film transistor disposed on the substrate and a display element electrically connected to the thin film transistor, in the display area; and an encapsulation layer disposed on the display element and extending to the second non-display area, wherein the encapsulation layer includes a first inorganic encapsulation layer, an organic encapsulation layer and a second inorganic encapsulation layer that are sequentially disposed, the organic encapsulation layer fills the first groove, and the first inorganic encapsulation layer and the second inorganic encapsulation layer contact each other in the second groove.

The inorganic barrier layer and the first inorganic encapsulation layer may contact each other in the first groove and the second groove.

The display device may further include, in the display area, a thin film transistor that is disposed on the substrate and includes a semiconductor layer, a gate electrode, a source electrode, and a drain electrode, and a display element electrically connected to the thin film transistor, wherein, in the display area, a first inorganic insulating layer disposed between the semiconductor layer and the gate electrode, a second inorganic insulating layer disposed between the gate electrode and the source electrode and the drain electrode, a planarization layer disposed between the thin film transistor and the display element, and a pixel defining layer disposed on the planarization layer are disposed, and the first inorganic insulating layer, the second inorganic insulating layer, the planarization layer, and the pixel defining layer extend to the second non-display area, and ends of the first inorganic insulating layer and the second inorganic insulating layer adjacent to the first groove are covered by the planarization layer or the pixel defining layer in a first area between the display area and the first groove.

A blocking portion upwardly protruding from the substrate may be disposed in a second area between the first groove and the second groove, the blocking portion including a first layer including a same material as the planarization layer and a second layer that is disposed on the first layer and includes a same material as the pixel defining layer.

According to one or more embodiments, a display device includes: a substrate including a display area, a first non-display area surrounding the display area, and a second non-display area surrounded by the display area, and a through portion disposed in the second non-display area, the substrate in the through portion being removed; a first groove disposed in the second non-display area in the substrate and surrounding the through portion; a second groove disposed between the first groove and the through portion in the substrate, and surrounding the through portion, and an inorganic barrier layer disposed on a region corresponding to the second non-display area. The substrate may include a first base layer, a first barrier layer, a second base layer and a second barrier layer that are sequentially disposed, the first groove and the second groove respectively extend from the second barrier layer to the second base layer in a depth direction of the substrate, and the inorganic barrier layer completely covers an exposed surface of the first groove and an exposed surface of the second groove, and directly contacts the first barrier layer on the bottom of the first groove and the bottom of the second groove.

The first groove and the second groove include undercut portions formed in the second base layer in a cross-sectional view.

The second barrier layer may include a pair of first tips that are disposed on undercut portions formed in the second base layer in a cross-sectional view and a pair of second tips that are disposed on the undercut portions formed in the second base layer in a cross-sectional view, wherein a reinforcement layer is further disposed between the pair of first tips and the inorganic barrier layer and between the pair of second tips and the inorganic barrier layer.

The reinforcement layer may include at least one material selected from the group consisting of indium tin oxide (ITO), indium zinc oxide (IZO), indium zinc tin oxide (ITZO), zinc gallium oxide (GZO), and indium zinc gallium oxide (IGZO).

The reinforcement layer may be disposed on a region corresponding to the second non-display area.

The display device may further include: a thin film transistor disposed on the substrate and a display element electrically connected to the thin film transistor, in the display area; and an encapsulation layer disposed on the display element and extending to the second non-display area, wherein the encapsulation layer includes a first inorganic encapsulation layer, an organic encapsulation layer and a second inorganic encapsulation layer that are sequentially disposed, wherein the organic encapsulation layer fills the first groove.

The inorganic barrier layer and the first inorganic encapsulation layer, and the first inorganic encapsulation layer and the second inorganic encapsulation layer may directly contact each other in the second groove.

The inorganic barrier layer and the first inorganic encapsulation layer may directly contact each other in the first groove and in the second groove.

The display device may further include, in the display area, a thin film transistor that is disposed on the substrate and includes a semiconductor layer, a gate electrode, a source electrode, and a drain electrode, and a display element electrically connected to the thin film transistor, wherein, in the display area, a first inorganic insulating layer disposed between the semiconductor layer and the gate electrode, a second inorganic insulating layer disposed between the gate electrode and the source electrode and the drain electrode, a planarization layer disposed between the thin film transistor and the display element, and a pixel defining layer disposed on the planarization layer are disposed, and the first inorganic insulating layer, the second inorganic insulating layer, the planarization layer and the pixel defining layer extend to the second non-display area, and ends of the first inorganic insulating layer and the second inorganic insulating layer disposed adjacent to the first groove are covered by the planarization layer or the pixel defining layer in a first area between the display area and the first groove.

A blocking portion upwardly protruding from the substrate may be disposed in a second area between the first groove and the second groove, wherein blocking portion includes a first layer including a same material as the planarization layer and a second layer that is disposed on the first layer and includes a same material as the pixel defining layer.

In addition to the aforesaid details, other aspects, features, and advantages will be clarified from the following drawings, claims, and detailed description.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Because the present disclosure may have diverse modifications and embodiments, representative embodiments are shown in the drawings and will be described in detail. Effects, features, and a method of achieving the same will be specified with reference to the embodiments described below in detail together with the attached drawings. However, the embodiments may have different forms and should not be construed as being limited to the descriptions set forth herein.

While such terms as "first," "second," etc., may be used to describe various components, such components must not be limited to the above terms. The above terms are used only to distinguish one component from another.

An expression used in the singular encompasses the expression of the plural, unless it has a clearly different meaning in the context.

In the present specification, it is to be understood that the terms such as "including" or "having" are intended to indicate the existence of the features or components disclosed in the specification, and are not intended to preclude the possibility that one or more other features or components may be added.

It will be understood that when a layer, region, or component is referred to as being "formed on" another layer, region, or component, it may be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order. As used herein, the term "and/or" includes any and all combinations of one or more of the associated listed items. Expressions such as "at least one of," when preceding a list of elements, modify the entire list of elements and do not modify the individual elements of the list.

The embodiments will be described below in more detail with reference to the accompanying drawings. Those components that are the same or are in correspondence are rendered the same reference numeral regardless of the figure number.

Figure 1:
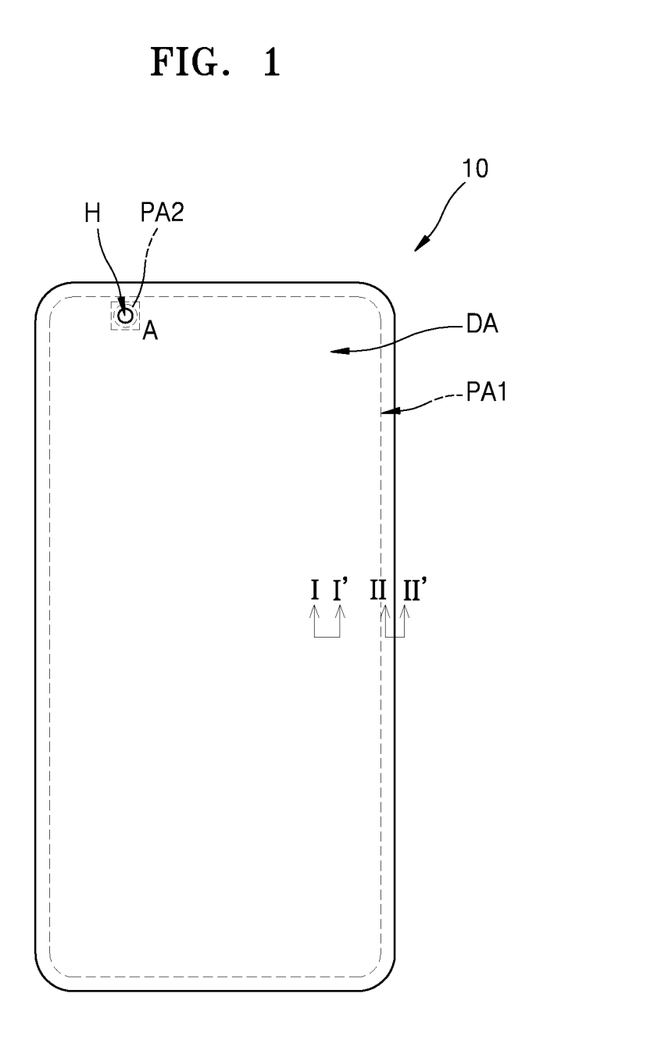
FIG. 1 is a schematic plan view of a display device according to an embodiment.
Figure 2:
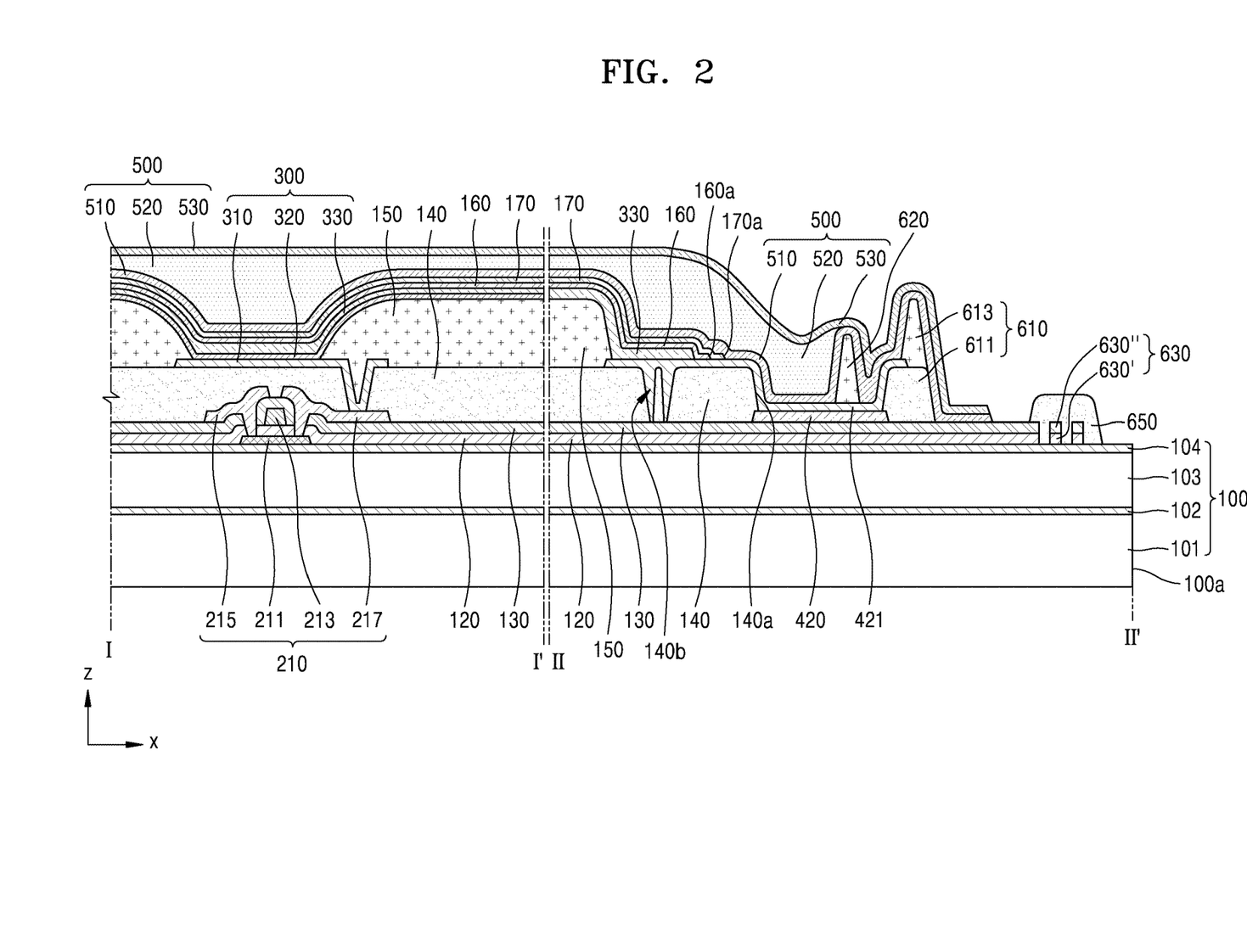
FIG. 2 is a schematic cross-sectional view of cross-sections taken along line I-I' and line II-II' of FIG. 1, according to an example.

FIG. 1 is a schematic plan view of a display device 10 according to an embodiment. FIG. 2 is a schematic cross-sectional view of cross-sections taken along line I-I' and line II-II' of FIG. 1, according to an example.

Referring to FIGS. 1 and 2, the display device 10 according to an embodiment of the present disclosure includes a display area DA displaying an image, a first non-display area PA1 in an outer portion of the display area DA, and a second non-display area PA2 at least partially surrounded by the display area DA. To put it differently, a substrate 100 includes the display area DA, the first non-display area PA1, and the second non-display area PA2.

Display elements are located in the display area DA, and the first non-display area PA1 may surround the display area DA and include a pad area or the like, in which various electronic devices, a printed circuit board, or the like are electrically attached.

Display elements and thin film transistors 210 electrically connected to the display elements may be located in the display area DA. FIG. 2 illustrates an organic light-emitting device 300 included as a display element in the display area DA. The organic light-emitting device 300 may include a pixel electrode 310 which is electrically connected to the thin film transistor 210.

The second non-display area PA2 is at least partially surrounded by the display area DA, and the substrate 100 may include at least one through portion H located within the second non-display area PA2. While FIG. 1 illustrates that the second non-display area PA2 which is located within the display area DA is completely surrounded by the display area DA, the present disclosure is not limited thereto. For example, a portion of the second non-display area PA2 may be disposed adjacent to the first non-display area PA1. The portion of the second non-display area PA2 may directly contact the first non-display area PA1. In addition, two or more through portions H may be formed within the second non-display area PA2.

The through portion H may be a space in which an additional member for performing a function of the display device 10 or an additional member capable of adding a new function to the display device 10 may be disposed. For example, a sensor, a light source, a camera module, or the like may be located in the through portion H.

Meanwhile, as the through portion H may be a portion in which the substrate 100 and a plurality of layers disposed on the substrate 100 are removed, moisture or oxygen from the outside may penetrate into the display device 10 through cross section of the display device 10 exposed by the through portion H. However, according to the present disclosure, at least one groove surrounding the through portion H are formed and an inorganic barrier layer is formed to cover the at least one grove, and thus, permeation as described above may be effectively prevented. The grooves will be described in detail later with reference to FIGS. 3 to 8. First, a structure of the display device 10 will be described with reference to FIG. 2.

The substrate 100 may include various materials. The substrate 100 may be formed of a transparent material when a display device is a bottom emission type in which an image is realized in a direction to the substrate 100. However, when a display device is a top emission type in which an image is displayed in an opposite direction, in a direction away from the substrate 100, the substrate 100 need not necessarily be formed of a transparent material. In this case, the substrate 100 may be formed of a metal. When forming the substrate 100 using a metal, the substrate 100 may include, for example, iron, chromium, manganese, nickel, titanium, molybdenum, and stainless steel (SUS), an Invar alloy, an Inconel alloy or a Kovar alloy.

For example, the substrate 100 may have a multilayer structure in which a first base layer 101, a first barrier layer 102, a second base layer 103, and a second barrier layer 104 are sequentially stacked.

The first base layer 101 and the second base layer 103 may be formed of, for example, a transparent glass material including $SiO_2$ as a main component. However, the first base layer 101 and the second base layer 103 are not limited thereto and may also be formed of a plastic material that is transparent. The plastic material may be, for example, polyethersulphone (PES), polyacrylate (PAR), polyetherimide (PEI), polyethylene napthalate (PEN), polyethylene terephthalate (PET), polyphenylene sulfide (PPS), polyarylate, polyimide, polycarbonate (PC), cellulose triacetate (TAC), cellulose acetate propionate (CAP), or the like.

The first base layer 101 and the second base layer 103 may have equal or different thicknesses. For example, the first base layer 101 and the second base layer 103 may each include polyimide and have a thickness of about 3 μm to about 20 μm.

The first barrier layer 102 and the second barrier layer 104 prevent penetration of external foreign substances into the display device 10 through the substrate 100 and may be a single layer or a multi-layer including an inorganic material such as silicon nitride ($SiN_x$) and/or silicon oxide ($SiO_x$). For example, the first barrier layer 102 may be a multi-layer including a silicon oxide layer and an amorphous silicon layer to increase an adhesive force between neighboring layers, and the second barrier layer 104 may be a silicon oxide layer. In addition, the first barrier layer 102 and the second barrier layer 104 may each have a thickness of about 4000 Å to about 7000 Å, but the present disclosure is not limited thereto.

A buffer layer may be further formed on the substrate 100. The buffer layer may provide a planarized surface on the substrate 100, and block foreign substances or moisture from penetrating in to the display device 10 through the substrate 100. For example, the buffer layer may include an inorganic material such as silicon oxide, silicon nitride, silicon oxynitride, aluminum oxide, aluminum nitride, titanium oxide or titanium nitride, or an organic material such as polyimide, polyester or acryl, or of a stacked structure in which the above-described materials are stacked. In some embodiments, the second barrier layer 104 of the substrate 100 described above may be regarded as a portion of the buffer layer having a multi-layer structure.

The thin film transistor 210 is arranged in the display area DA of the substrate 100, and a display element electrically connected to the thin film transistor 210 is also arranged in the display area DA in addition to the thin film transistor 210. FIG. 2 illustrates the organic light-emitting device 300 as a display element. A thin film transistor (not shown) may also be arranged in the first non-display area PA1 of the substrate 100. The thin film transistor located in the first non-display area PA1 may be, for example, a portion of a circuit that controls an electrical signal applied to the display area DA.

The thin film transistor 210 includes a semiconductor layer 211 including amorphous silicon, polycrystalline silicon, or an organic semiconductor material, a gate electrode 213, a source electrode 215, and a drain electrode 217. When a buffer layer is arranged on the substrate 100, the semiconductor layer 211 may be disposed on the buffer layer.

The gate electrode 213 is arranged above the semiconductor layer 211 to overlap the semiconductor layer 211. The source electrode 215 and the drain electrode 217 are electrically connected each other through a channel formed between the source electrode 215 and the drain electrode 217 when a gate signal turn on the thin film transistor 210 is applied to the gate electrode 213. The gate electrode 213 may include, for example, one or more materials selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu) and may have a single-layer or multi-layer structure. To insulate the semiconductor layer 211 from the gate electrode 213, a first inorganic insulating layer 120 formed of an inorganic material such as silicon oxide, silicon nitride, or silicon oxynitride may be disposed between the semiconductor layer 211 and the gate electrode 213.

A second inorganic insulating layer 130 may be arranged on the gate electrode 213. The second inorganic insulating layer 130 may have a single-layer or multi-layer structure formed of an inorganic material such as silicon oxide, silicon nitride or silicon oxynitride.

The source electrode 215 and the drain electrode 217 are arranged on the second inorganic insulating layer 130. The source electrode 215 and the drain electrode 217 are respectively electrically connected to the semiconductor layer 211 via a contact hole formed in the second inorganic insulating layer 130 and the first inorganic insulating layer 120. The source electrode 215 and the drain electrode 217 may include, for example, one or more materials selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu), considering conductive properties, and may have a single-layer or multi-layer structure.

A protection layer (not shown) covering the thin film transistor 210 may be arranged to protect the thin film transistor 210, for example. The protection layer may be formed of an inorganic material such as silicon oxide, silicon nitride, or silicon oxynitride. The protection layer may be a single layer or a multi-layer.

A planarization layer 140 may be arranged on the thin film transistor 210. For example, as illustrated in FIG. 2, when the organic light-emitting device 300 is arranged at a higher level than the thin film transistor 210, the planarization layer 140 may cover the thin film transistor 210 to planarize uneven surface formed due to the thin film transistor 210. The planarization layer 140 may include an organic insulating material such as acryl, benzocyclobutene (BCB), or hexamethyldisiloxane (HMDSO). The planarization layer 140 illustrated in FIG. 2 is a single layer, but may also be a multi-layer or modified in other various manners. The display device 10 according to the present embodiment may also include both a protection layer and the planarization layer 140 or just the planarization layer 140 as necessary.

In the display area DA of the substrate 100, the organic light-emitting device 300 including the pixel electrode 310, an opposite electrode 330, and an intermediate layer 320 disposed between the pixel electrode 310 and the opposite electrode 330 is arranged on the planarization layer 140.

An opening portion exposing at least one of the source electrode 215 and the drain electrode 217 of the thin film transistor 210 is formed in the planarization layer 140, and the pixel electrode 310 contacting one of the source electrode 215 and the drain electrode 217 through the opening portion to be electrically connected to the thin film transistor 210 is arranged on the planarization layer 140.

The pixel electrode 310 may include a (semi)transparent electrode or a reflective electrode.

When the pixel electrode 310 includes a (semi)transparent electrode, the pixel electrode 310 may include, for example, ITO, IZO, ZnO, $In_2O_3$, IGO or AZO. When the pixel electrode 310 includes a reflective electrode, the pixel electrode 310 may include a layer formed of Ag, Mg, Al, Pt, Pd, Au, Ni, Nd, Ir, Cr or a compound thereof and a layer formed of ITO, IZO, ZnO, $In_2O_3$, IGO or AZO. However, the present disclosure is not limited thereto, and the pixel electrode 310 may include various materials and have single-layer or multilayer structure or other various modified structures.

A pixel defining layer 150 may be arranged on the pixel electrode. The pixel defining layer 150 has an opening corresponding to each sub-pixel to expose a center portion of the pixel electrode 310 to define a pixel. In addition, as illustrated in FIG. 2, the pixel defining layer 150 may increase a distance between an edge of the pixel electrode 310 and the opposite electrode 330 disposed above the pixel electrode 310, thereby preventing generation of an arc or the like at the edge of the pixel electrode 310. The pixel defining layer 150 may include an organic insulating material such as polyimide or HMDSO.

The intermediate layer 320 of the organic light-emitting device 300 may include an emissive layer. The emissive layer may include a polymer or a low-molecular-weight organic material that emits light of a predetermined color. In addition, the intermediate layer 320 may include at least one functional layer among a hole transport layer (HTL), a hole injection layer (HIL), an electron transport layer (ETL), and an electron injection layer (EIL). These functional layers may include an organic material. Meanwhile, some of a plurality of layers constituting the intermediate layer 320, for example, a functional layer(s) may be integrally formed over a plurality of organic light-emitting devices 300.

The opposite electrode 330 may be arranged to cover the display area DA. The opposite electrode 330 may be integrally formed over a plurality of organic light-emitting devices 300 and correspond to a plurality of pixel electrodes 310. The opposite electrode 330 may include a (semi) transparent electrode or a reflective electrode. When the opposite electrode 330 includes a (semi)transparent electrode, the opposite electrode 330 may have a metal having a small work function, that is, Li, Ca, LiF/Ca, LiF/Al, Al, Ag, Mg, or a compound thereof and a (semi)transparent conductive layer formed of ITO, IZO, ZnO or $In_2O_3$, or the like. When the opposite electrode 330 includes a reflective electrode, the opposite electrode 330 may have a layer formed of Li, Ca, LiF/Ca, LiF/Al, Al, Ag, Mg and a compound thereof. The structure and material of the opposite electrode 330 are not limited thereto, and various modifications may also be made.

Meanwhile, in order for the display device 10 to display an image, a predetermined electrical signal is applied to the opposite electrode 330. To this end, a voltage line 420 is located in the first non-display area PA1 to transmit the predetermined electrical signal to the opposite electrode 330. The voltage line 420 may be a common power voltage ELVSS line.

The voltage line 420 may be simultaneously formed of a same material as conductive layers when forming various conductive layers in the display area DA. Similarly to the source electrode 215 and the drain electrode 217 of the thin film transistor 210 located on the second inorganic insulating layer 130 in the display area DA, the voltage line 420 is illustrated as being located on the second inorganic insulating layer 130 in the first non-display area PA1. In this case, when forming the source electrode 215 and the drain electrode 217 of the thin film transistor 210 on the second inorganic insulating layer 130 in the display area DA, the voltage line 420 is formed of a same material as the source electrode 215 and the drain electrode 217 on the second inorganic insulating layer 130 in the first non-display area PA1. Accordingly, the voltage line 420 has a same structure as the source electrode 215 and the drain electrode 217. The present disclosure is not limited thereto, and various modifications may also be made; for example, when forming the gate electrode 213, the voltage line 420 may be simultaneously formed of a same material as the gate electrode 213 on the first inorganic insulating layer 120.

The opposite electrode 330 may directly contact with the voltage line 420 or may be electrically connected to the voltage line 420 via a protection conductive layer 421 as illustrated in FIG. 2. The protection conductive layer 421 may be located on the planarization layer 140 and extend to the voltage line 420 to electrically connect the voltage line 420 to the opposite electrode 330. Accordingly, the opposite electrode 330 may contact the protection conductive layer 421 in the first non-display area PA1, and the protection conductive layer 421 may also contact the voltage line 420 in the first non-display area PA1.

As illustrated in FIG. 2, the protection conductive layer 421 is located on the planarization layer 140, and thus, the protection conductive layer 421 may be simultaneously formed of a same material as a component located on the planarization layer 140 in the display area DA. In detail, when forming the pixel electrode 310 on the planarization layer 140 in the display area DA, the protection conductive layer 421 may be simultaneously formed of a same material as the pixel electrode 310 on the planarization layer 140 in the first non-display area PA1. Accordingly, the protection conductive layer 421 has a same structure as the pixel electrode 310. The protection conductive layer 421 may contact a portion of the voltage line 420 that is not covered by the planarization layer 140 but is exposed, as illustrated in FIG. 2. To this end, damage to the voltage line 420 exposed outside the planarization layer 140 during formation of a first restriction dam 610 or a second restriction dam 620 may be prevented.

Meanwhile, to prevent penetration of foreign substances such as oxygen or moisture from the outside into the planarization layer 140 and thus into the display area DA, the planarization layer 140 may have an opening 140b in the first non-display area PA1 as illustrated in FIG. 2. The opening 140b may surround the display area DA. In addition, when forming the protection conductive layer 421, the protection conductive layer 421 may be filled in the opening 140b. Accordingly, foreign substances that have penetrated into the planarization layer 140 of the first non-display area PA1 may be effectively prevented from penetrating into the planarization layer 140 in the display area DA.

A capping layer 160 having a function of increasing the efficiency of light generated in the organic light-emitting device 300 may be located on the opposite electrode 330. The capping layer 160 may cover the opposite electrode 330 and extend beyond the opposite electrode 330 to contact the protection conductive layer 421 that is under the opposite electrode 330. As the opposite electrode 330 covers the display area DA and extends beyond the display area DA, the capping layer 160 also covers the display area DA and extends to the first non-display area PA1 in an outer portion of the display area DA. The capping layer 160 includes an inorganic or organic material.

As described above, the capping layer 160 increases the efficiency of light generated in the organic light-emitting device 300. For example, the capping layer 160 may increase the efficiency of light extraction to the outside. The increase in efficiency by using the capping layer 160 may be uniformly achieved in the display area DA. Considering this, the capping layer 160 may have an upper surface corresponding to curves of an upper surface of a layer under the capping layer 160.

That is, as illustrated in FIG. 2, an upper surface of the capping layer 160 in a portion of the capping layer 160 located on the opposite electrode 330 may have a shape corresponding to curves of an upper surface of the opposite electrode 330.

An encapsulation layer 500 is located above the capping layer 160. The encapsulation layer 500 protects the organic light-emitting device 300 from moisture or oxygen from the outside. To this end, the encapsulation layer 500 may cover not only the display area DA where the organic light-emitting device 300 is located but also the first non-display area PA1 in an outer portion of the display area DA. The encapsulation layer 500 may have a multi-layer structure. In detail, as illustrated in FIG. 2, the encapsulation layer 500 may include a first inorganic encapsulation layer 510, an organic encapsulation layer 520, and a second inorganic encapsulation layer 530.

The first inorganic encapsulation layer 510 covers the capping layer 160, and may include silicon oxide, silicon nitride and/or silicon oxynitride or the like.

As the first inorganic encapsulation layer 510 is formed according to a structure therebelow, an upper surface of the first inorganic encapsulation layer 510 may not be flat as illustrated in FIG. 2. The organic encapsulation layer 520 covers the first inorganic encapsulation layer 510 and has a sufficient thickness, and thus, an upper surface of the organic encapsulation layer 520 may be substantially flat over the entire display area DA. The organic encapsulation layer 520 may include polyethylene terephthalate, polyethylene naphthalate, polycarbonate, polyimide, polyethylene sulfonate, polyoxymethylene, polyarylate, hexamethyldisiloxane, an acrylic resin (e.g., polymethylmethacrylate, polyacrylic acid, etc.) or a combination of any of these.

The second inorganic encapsulation layer 530 may cover the organic encapsulation layer 520 and may include silicon oxide, silicon nitride and/or silicon oxynitride or the like. The second inorganic encapsulation layer 530 may extend beyond the organic encapsulation layer 520 to contact the first inorganic encapsulation layer 510, thereby preventing the organic encapsulation layer 520 from being exposed to the outside.

As the encapsulation layer 500 includes the first inorganic encapsulation layer 510, the organic encapsulation layer 520, and the second inorganic encapsulation layer 530, even when a crack is generated in the encapsulation layer 500, the crack may not be connected between the first inorganic encapsulation layer 510 and the organic encapsulation layer 520 or between the organic encapsulation layer 520 and the second inorganic encapsulation layer 530 by using the multi-layer structure as described above. Accordingly, a path through which water, oxygen, etc. from the outside penetrates into the display area DA may be prevented or minimized.

Meanwhile, while forming the encapsulation layer 500, structures under the encapsulation layer 500 may be damaged. For example, the first inorganic encapsulation layer 510 may be formed using a chemical vapor deposition method, and when forming the first inorganic encapsulation layer 510 by using the chemical vapor deposition method, layers directly under the first inorganic encapsulation layer 510 may be damaged. Thus, when the first inorganic encapsulation layer 510 is formed on the capping layer 160, the capping layer 160, which has a function of increasing the efficiency of light generated in the organic light-emitting device 300, may be damaged, decreasing a light efficiency of the display device 10. Thus, to prevent damage to the capping layer 160 while forming the encapsulation layer 500, a protection layer 170 may be disposed between the capping layer 160 and the encapsulation layer 500. The protection layer 170 may include LiF.

As described above, the capping layer 160 extends not only to the display area DA but also to the first non-display area PA1 in an outer portion of the display area DA. Accordingly, as the protection layer 170 extends beyond the capping layer 160, the capping layer 160 and the encapsulation layer 500 may not directly contact each other. In this case, the protection layer 170 covers an end 160a of the capping layer 160, and an end 170a of the protection layer 170 is located on the planarization layer 140. In detail, as illustrated in FIG. 2, the end 170a of the protection layer 170 directly contacts the protection conductive layer 421 on the planarization layer 140.

Accordingly, the first inorganic encapsulation layer 510, which is a lowermost layer of the encapsulation layer 500, may not directly contact the capping layer 160 formed of an organic material and is in contact with the protection layer 170, which is formed of an inorganic material such as LiF, thus maintaining a high adhesive force between the encapsulation layer 500 and layers therebelow. Accordingly, in a manufacturing process of the display device 10 and other subsequent usage processes, peeling of the encapsulation layer 500 from the layers under the encapsulation layer 500 may be effectively prevented or minimized.

When forming the organic encapsulation layer 520, it is desirable to form the organic encapsulation layer 520 only in the predetermined area. To this end, as illustrated in FIG. 2, the first restriction dam 610 may be located in the first non-display area PA1. In detail, the first inorganic insulating layer 120 and the second inorganic insulating layer 130, and the planarization layer 140 may also be formed not only in the display area DA of the substrate 100 but also in the first non-display area PA1 as illustrated in FIG. 2. The first restriction dam 610 is located in the first non-display area PA1 to be spaced apart from the planarization layer 140.

The first restriction dam 610 may have a multilayer structure. That is, the first restriction dam 610 may include a first layer 611 and a second layer 613 sequentially disposed in a direction away from the substrate 100. The first layer 611 may be simultaneously formed with the planarization layer 140 using a same material when forming the planarization layer 140 of the display area DA, and the second layer 613 may be simultaneously formed with the pixel defining layer 150 using a same material when forming the pixel defining layer 150 of the display area DA.

As illustrated in FIG. 2, besides the first restriction dam 610, the second restriction dam 620 may also be present between the first restriction dam 610 and the end 140a of the planarization layer 140. The second restriction dam 620 may be located on a portion of the protection conductive layer 421 on the voltage line 420. The second restriction dam 620 is also spaced apart from the planarization layer 140 and located in the first non-display area PA1. The second restriction dam 620 may also have a multilayer structure like the first restriction dam 610, and may include fewer layers than the first restriction dam 610 such that the second restriction dam 620 may have a height lower than the first restriction dam 610 from the substrate 100. In FIG. 2, the second restriction dam 620 formed of a same material as and simultaneously with the second layer 613 of the first restriction dam 610 is illustrated.

Accordingly, a position of the organic encapsulation layer 520 is limited by the second restriction dam 620, and thus, overflowing of a material used to form the organic encapsulation layer 520 out of the second restriction dam 620 may be prevented. Even when the material used to form the organic encapsulation layer 520 overflows partially out of the second restriction dam 620, a position of the organic encapsulation layer 520 is limited by the first restriction dam 610, and thus, the organic encapsulation layer 520 may not be disposed on an edge 100a of the substrate 100. Moreover, the first inorganic encapsulation layer 510 and the second inorganic encapsulation layer 530 formed using a chemical vapor deposition method cover the second restriction dam 620 and the first restriction dam 610 to completely cover the first restriction dam 610 as illustrated in FIG. 2.

Meanwhile, a crack preventing portion 630 is located in the first non-display area PA1. The crack preventing portion 630 may extend along at least a portion of the edge 100a of the substrate 100. For example, the crack preventing portion 630 may be formed to completely surround the display area DA. In some sections, the crack preventing portion 630 may also have a discontinuous shape. The crack preventing portion 630 may prevent a crack that may be formed in the first inorganic insulating layer 120 and the second inorganic insulating layer 130, which are formed of an inorganic material, when cutting a mother substrate during a manufacturing process of the display device 10 or due to impact applied during use of the display device 10 from reaching the display area DA.

The crack preventing portion 630 may have various shapes and may be simultaneously formed of a same material as some components formed in the display area DA, as illustrated in FIG. 2, or may have a multi-layer structure. In FIG. 2, the crack preventing portion 630 having a multilayer structure including a lower layer 630' and an upper layer 630" located on the lower layer 630' is illustrated. In detail, in FIG. 2, the crack preventing portion 630 including the lower layer 630' including a same material as the first inorganic insulating layer 120 and the upper layer 630" including a same material as the second inorganic insulating layer 130 on the first inorganic insulating layer 120 is illustrated. When a buffer layer is formed on the substrate 100, the crack preventing portion 630 may also include a layer including a same material as the buffer layer. Also, as illustrated in FIG. 2, a plurality of crack preventing portions 630 spaced apart from each other may also be included.

The crack preventing portion 630 may be understood as being formed by removing portions of the first inorganic insulating layer 120 and the second inorganic insulating layer 130. That is, as illustrated in FIG. 2, a groove formed by removing the first inorganic insulating layer 120 and the second inorganic insulating layer 130 is formed at least at a side of the crack preventing portion 630, and the crack preventing portion 630 may include remaining portions of the first inorganic insulating layer 120 and the second inorganic insulating layer 130 that are adjacent to the groove.

The crack preventing portion 630 may be covered by the cover layer 650 as illustrated in FIG. 2. When forming, for example, the planarization layer 140 in the display area DA, the cover layer 650 may be simultaneously formed of a same material as the planarization layer 140. That is, the cover layer 650 may also be formed of an organic material covering the crack preventing portion 630, which includes an inorganic material. The cover layer 650 may cover an end of the first inorganic insulating layer 120 and/or the second inorganic insulating layer 130 toward the edge 100a of the substrate 100 and may also cover the crack preventing portion 630.

Figure 3:
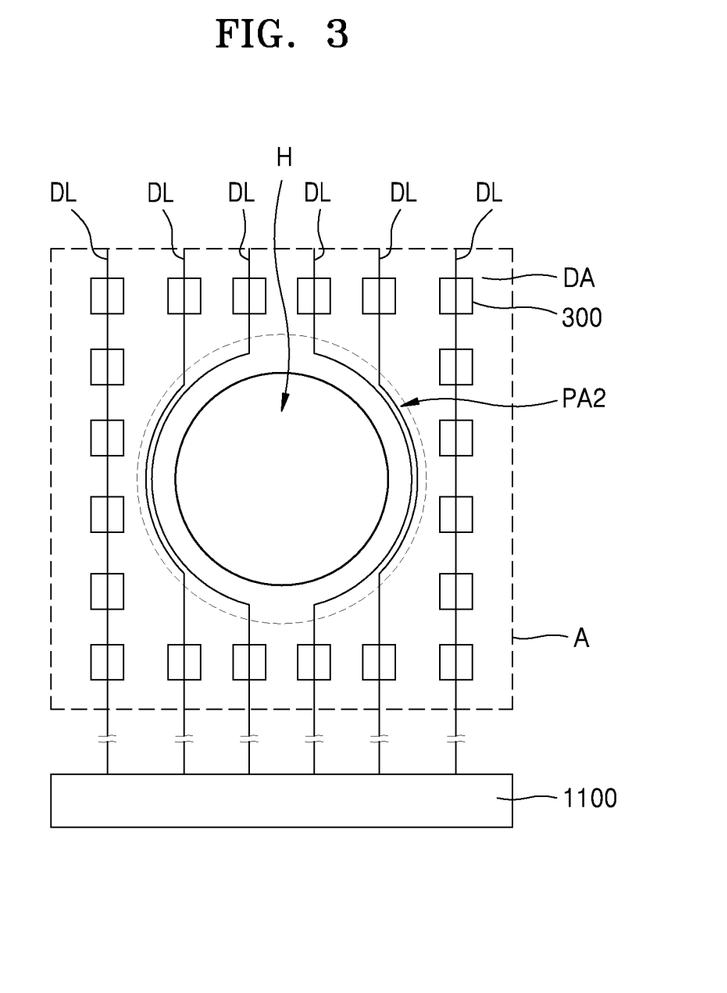
FIG. 3 is a schematic expanded plan view of a region A of FIG. 1.
Figure 4:
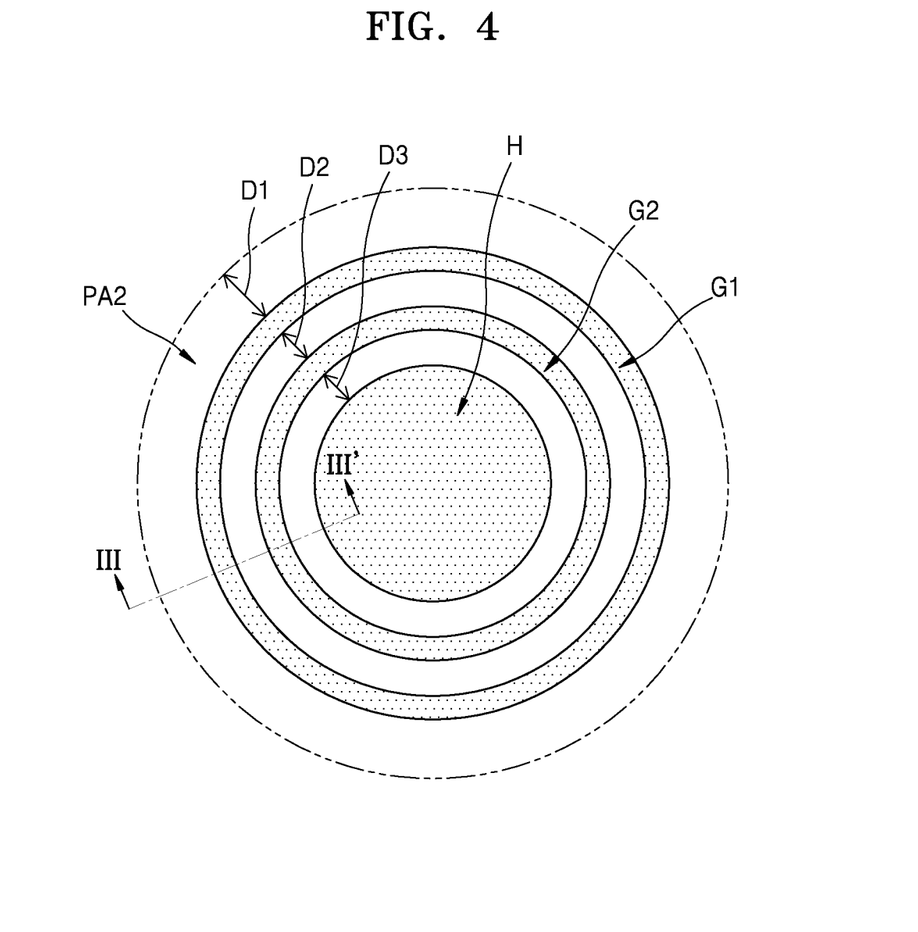
FIG. 4 is a schematic plan view of a through portion of FIG. 3 according to an example.
Figure 5:
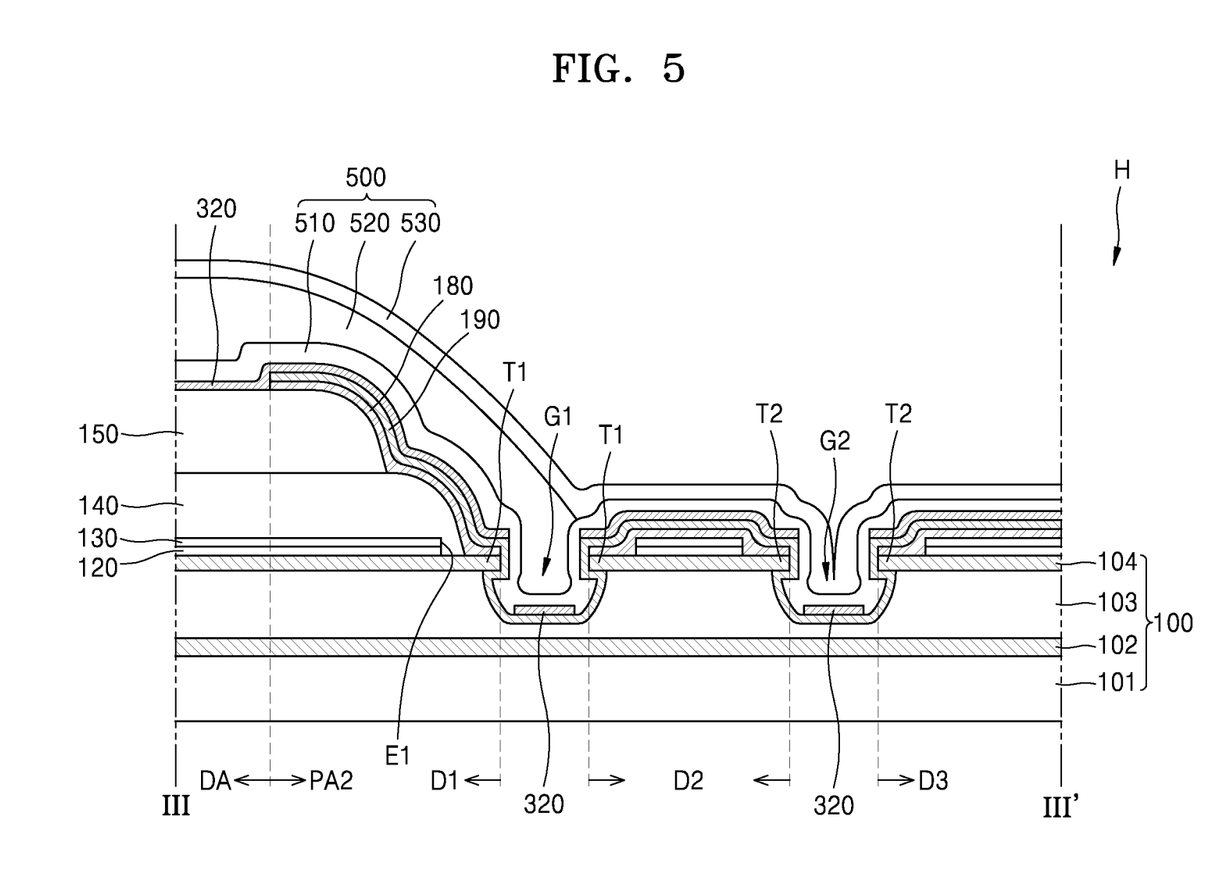
FIG. 5 is a schematic cross-sectional view of a cross-section taken along line III-III' of FIG. 4, according to an example.
Figure 6:
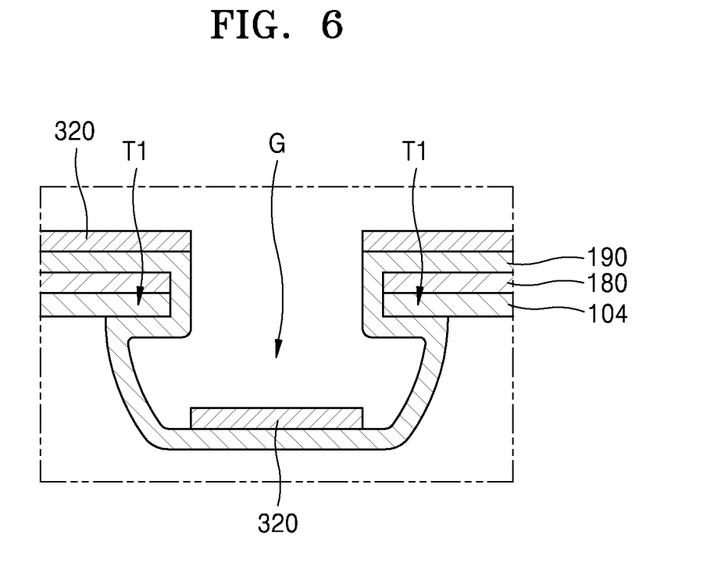
FIG. 6 is a schematic cross-sectional view of a first groove of FIG. 5.

FIG. 3 is a schematic expanded plan view of a region A of FIG. 1. FIG. 4 is a schematic plan view of a through portion of FIG. 3 according to an example. FIG. 5 is a schematic cross-sectional view of a cross-section taken along line III-III' of FIG. 4, according to an example. FIG. 6 is a schematic cross-sectional view of a first groove of FIG. 5.

FIG. 3 illustrates the through portion H and areas surrounding the through portion H. Referring to FIG. 3, a plurality of organic light-emitting devices 300 electrically connected to data lines DL are arranged in the display area DA around the through portion H, and the second non-display area PA2 may be defined as an area between the through portion H and the display area DA, where no image is displayed.

The data lines DL may extend in a first direction and are electrically connected to a data driver 1100. For example, the data driver 1100 may be a chip on panel (COP) type and arranged in the first non-display areas PA1 (FIG. 1), or on a flexible circuit board (not shown) electrically connected to a terminal included in the first non-display area PA1 (FIG. 1).

Meanwhile, some of the data lines DL extending in the first direction may not extend straight in the first direction due to the through portion H arranged in the display area DA. In this case, some of the data lines DL may be formed to bypass the through portion H, and the data lines DL bypassing the through portion H are located in the second non-display area PA2 around the through portion H.

Meanwhile, although not illustrated in FIG. 3, scan lines may extend in a second direction and intersect the data lines DL, and some of the scan lines may be formed to bypass the through portion H in an area where the through portion H is formed. Alternatively, as the display device 10 (FIG. 1) includes two scan drivers respectively arranged on two sides of the display area DA, the scan lines may not bypass the through portion H. That is, a scan line that is electrically connected to the organic light-emitting devices 300 arranged on the left side of the through portion H and a scan line that is electrically connected to the organic light-emitting devices 300 arranged on the right side of the through portion H may be connected to different scan drivers from each other.

Referring to FIGS. 4 and 6 in which the through portion H is illustrated in detail, at least two grooves G1 and G2 surrounding the through portion H may be formed to surround the through portion H in the substrate 100. Meanwhile, while a first groove G1 and a second groove G2 surrounding the through portion H are illustrated in FIGS. 4 and 5, the present disclosure is not limited thereto, and three or more grooves may also be formed. Hereinafter, two grooves (the first and second grooves G1 and G2) formed to surround the through portion H are described. The second groove G2 may surround the through portion H and the first groove G1 may surround the second groove G2 in a plan view. That is, a groove that is farthest from the through portion H is referred to as the first groove G1.

The first groove G1 surrounds the through portion H and is disposed spaced a predetermined distance apart from the through portion H. The second groove G2 surrounds the through portion H and is disposed between the first groove G1 and the through portion H. The first groove G1 and the second groove G2 may have an undercut structure. For example, the first groove G1 and the second groove G2 may be formed in the second barrier layer 104 and the second base layer 103 of the substrate 100. The second barrier layer 104 in the first groove G1 may include a pair of first tips T1 and the second barrier layer 104 in the second groove G2 may include a pair of second tips T2 under which the undercuts are formed in a cross-sectional view.

Each of the first groove G1 and the second groove G2 may be formed by, for example, forming an opening in the second barrier layer 104 by patterning the second barrier layer 104 using a mask and then etching, the exposed second base layer 103 using an anisotropic etching, for example, a wet-etching or a plasma etching. Accordingly, the second base layer 103 may be removed by a greater width than the opening of the second barrier layer 104 by using the anisotropic etching thus forms the undercuts.

That is, the first groove G1 and the second groove G2 may have a width that is smaller in the second barrier layer 104 than that in the second base layer 103, and the second barrier layer 104 may include a pair of first tips T1 and a pair of second tips T2 each having a cantilever shape and facing each other at the upper portion of the opening of the first groove G1 and the second groove G2 in a cross-sectional view. A width of the first groove G1 and a width of the second groove G2 refer to distances measured in a direction perpendicular to a length direction of the first groove G1 and the second groove G2, respectively. For example, when each of the first groove G1 and the second groove has a circular ring shape, widths of the first groove G1 and the second groove G2 refer to a radial direction of the circular shape. In addition, when a buffer layer is further formed on the substrate 100, the buffer layer may be used to form the first tips T1 and the second tips T2 in combination with the second barrier layer 104.

A reinforcement layer 180 and an inorganic barrier layer 190 are stacked on the pair of first tips T1 and the pair of second tips T2 in a cross-sectional view.

A mask used to form an opening in the second barrier layer 104 by patterning the second barrier layer 104 is removed from the display area DA after patterning the second barrier layer 104 but remains in the second non-display area PA2 to thereby form the reinforcement layer 180. That is, the reinforcement layer 180 may be disposed on a region corresponding to the second non-display area PA2. The reinforcement layer 180 may be disposed on the pair of first tips T1 and the pair of the second tips T2 to increase the mechanical strength of the first tips T1 and the second tips T2.

Accordingly, even when impact is applied to the first tips T1 and the second tips T2, damage to the first tips T1 and the second tips T2 is prevented, thus preventing cracks in the inorganic barrier layer 190 and/or the first inorganic encapsulation layer 510 of the encapsulation layer 500 due to damage to the first tips T1. The reinforcement layer 180 as described above may include at least one material selected from the group consisting of indium tin oxide (ITO), indium zinc oxide (IZO), indium zinc tin oxide (ITZO), zinc gallium oxide (GZO), and indium zinc gallium oxide (IGZO).

In addition, the inorganic barrier layer 190 may be further formed in the second non-display area PA2. The inorganic barrier layer 190 formed in the second non-display area PA2 may be used as an etching mask when removing the mask used to form an opening in the second barrier layer 104 from the display area DA. In addition, the inorganic barrier layer 190 may be continuously formed in the second non-display area PA2 without being disconnected.

The reinforcement layer 180 may be formed on the entire second non-display area PA2 except the first groove G1 and the second groove G2. The inorganic barrier layer 190 may be formed on the entire second non-display area PA2 including the first groove G1 and the second groove G2. The inorganic barrier layer 190 may cover exposed portion of the reinforcement layer 180, the second barrier layer 104 and the second base layer 103 in the first groove G1 and the second groove G2. The inorganic barrier layer 190 may cover a lower surface of the first tips T1 and the second tips T2. The inorganic barrier layer 190 as described above may include a conformal inorganic film such as silicon oxide, silicon nitride and silicon oxynitride.

Meanwhile, as described above, some of a plurality of layers constituting the intermediate layer 320, for example, functional layer(s) may be formed integrally over the plurality of organic light-emitting devices 300 (FIG. 2), and thus are formed not only in the display area DA but also in the second non-display area PA2. However, due to the undercut structure formed by the pair of first tips T1 and the second tips T2, the intermediate layer 320 may not be formed on the internal wall surface of the first groove G1 but be formed only on a portion of the bottom surface of the first groove G1. Thus, organic layers included in the intermediate layer 320 are disconnected by the first groove G1, thereby preventing moisture or oxygen from the outside from penetrating into the display area DA through the organic layers exposed by the through portion H. In addition, because each of internal surfaces of the first groove G1 and the second groove G2 is covered by the inorganic barrier layer 190 and the organic layers disposed on the inorganic barrier layer 190 has disconnected portion on the bottom of the first groove G1, penetration of moisture or oxygen from the outside through the through portion H into the display area DA along the organic layers may be prevented effectively.

The encapsulation layer 500 is disposed on the inorganic barrier layer 190 on the pixel defining layer 150. As described above, due to the undercut structure of the first groove G1 and the second groove G2, the intermediate layer 320 is not formed on the internal wall surfaces of the first groove G1 and the second groove G2. However, the first inorganic encapsulation layer 510 of the encapsulation layer 500 formed using a chemical vapor deposition method, or the like, is formed conformally, and thus, the first inorganic encapsulation layer 510 may be continuously formed in the second non-display area PA2 like the inorganic barrier layer 190. Accordingly, as the first inorganic encapsulation layer 510 is in contact with the inorganic barrier layer 190 in the second non-display area PA2 and thus maintains a high adhesive force, peeling of the encapsulation layer 500 during a manufacturing process of the display device 10 (FIG. 1) or subsequent use of the display device 10 may be effectively prevented or minimized.

The organic encapsulation layer 520 may be formed on the first inorganic encapsulation layer 510 to fill the first groove G1. Accordingly, the reinforcement layer 180, the inorganic barrier layer 190, or the like are stacked to distribute stress concentrated on the first tips T1, thereby preventing damage to the first tips T1. In addition, when forming the organic encapsulation layer 520, as a material used to form the organic encapsulation layer 520 is filled in the first groove G1, the material for forming the organic encapsulation layer 520 may be prevented from over-flowing toward the second groove G2, thus limiting an area in which the organic encapsulation layer 520 is formed.

The second inorganic encapsulation layer 530 may be formed in a similar manner to the first inorganic encapsulation layer 510. Accordingly, as the second inorganic encapsulation layer 530 and the first inorganic encapsulation layer 510 contact each other in the second groove G2, penetration of moisture and oxygen from the outside may be effectively prevented.

The second non-display area PA2 which includes the first groove G1 and the second groove G2 thus includes three areas, first through third areas D1, D2, and D3 are illustrated as an example. However, the second non-display areas PA2 may include four or more areas when three or more grooves are formed. Meanwhile, when three or more grooves are formed, grooves other than the first groove may have a same shape as the second groove G2.

The first area D1 is disposed between the first groove G1 and the display area DA, and may be an area between an end of the first tip T1 at the non-display area NDA and the display area DA. Some of the data lines DL bypassing the through portion H may be arranged in the first area D1. The second area D2 is disposed between the first groove G1 and the second groove G2, and indicates an area from an end of the first tip T1 adjacent to the second groove G1 to an end of the second tip T2 adjacent to the first groove G2. The third area D3 is an area from an end of the second tip T2 adjacent to the through portion H to the through portion H, and provides a cutting margin in an operation of forming the through portion H.

As described above, inorganic insulating layers such as the first inorganic insulating layer 120 and the second inorganic insulating layer 130 that may be present not only in the display area DA but also in the non-display areas (PA1 and PA2 in FIG. 1) may also be present in the first area D1, the second area D2, and the third area D3. An end portion of an inorganic insulating layer facing the through portion H in the first area D1 that is disposed adjacent to the display area DA may be covered by the planarization layer 140. Accordingly, steps due to an inorganic insulating layer are not generated on an upper surface of the first tips T1, and thus, defects such as cracks in the first inorganic encapsulation layer 510 or the like due to steps may be prevented. Alternatively, an end portion E1 of the inorganic insulating layer may be exposed out of the planarization layer 140, and the exposed end portion E1 of the inorganic insulating layer may be covered by the pixel defining layer 150.

Figure 7:
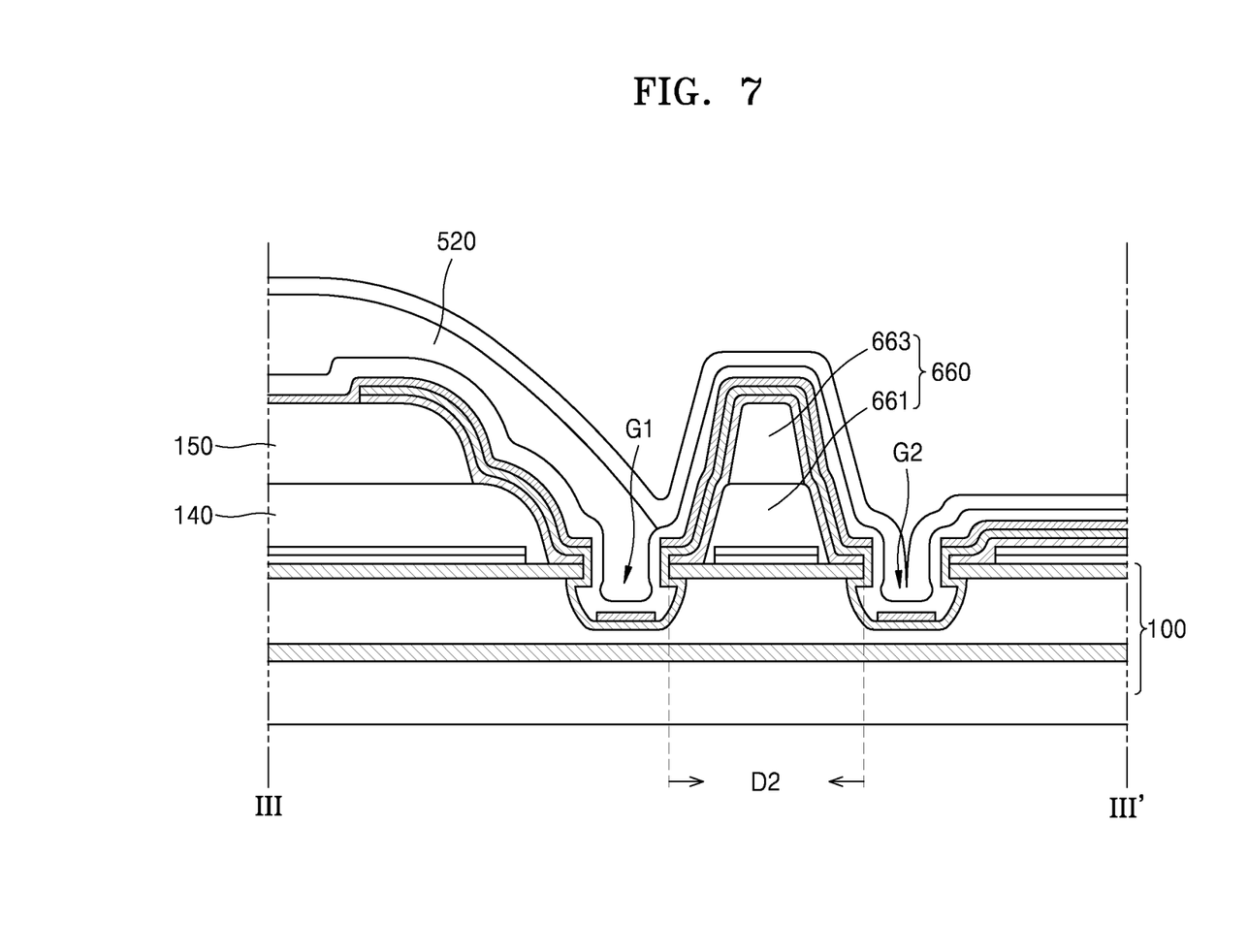
FIG. 7 is a schematic cross-sectional view of a cross-section taken along line III-III' of FIG. 4, according to another example.

FIG. 7 is a schematic cross-sectional view of a cross-section taken along line III-III' of FIG. 4, according to another example. Hereinafter, details that are described above will not be repeatedly described, and description will focus on differences from the previous embodiments.

Referring to FIG. 7, a blocking portion 660 may be located in the second area D2. When forming the organic encapsulation layer 520, the blocking portion 660 may effectively block a material for forming the organic encapsulation layer 520, filled in the first groove G1, from over-flowing to the second groove G2. For example, the blocking portion 660 may have a multi-layer structure. That is, the blocking portion 660 may include a first layer 661 and a second layer 663 sequentially laminated in a direction away from the substrate 100. The first layer 661 may be simultaneously formed with the planarization layer 140 and be formed of a same material as the planarization layer 140, and the second layer 663 may be simultaneously formed with the pixel defining layer 150 and be formed of a same material as the pixel defining layer 150. Alternatively, the blocking portion 660 may have a single-layer structure, and when the blocking portion 660 has a single-layer structure, the blocking portion 660 may include only the first layer 661 or the second layer 663 described above. As another example, the blocking portion 660 may further include a third layer that is formed on the second layer 663 and of a same material as the pixel defining layer 150.

Figure 8:
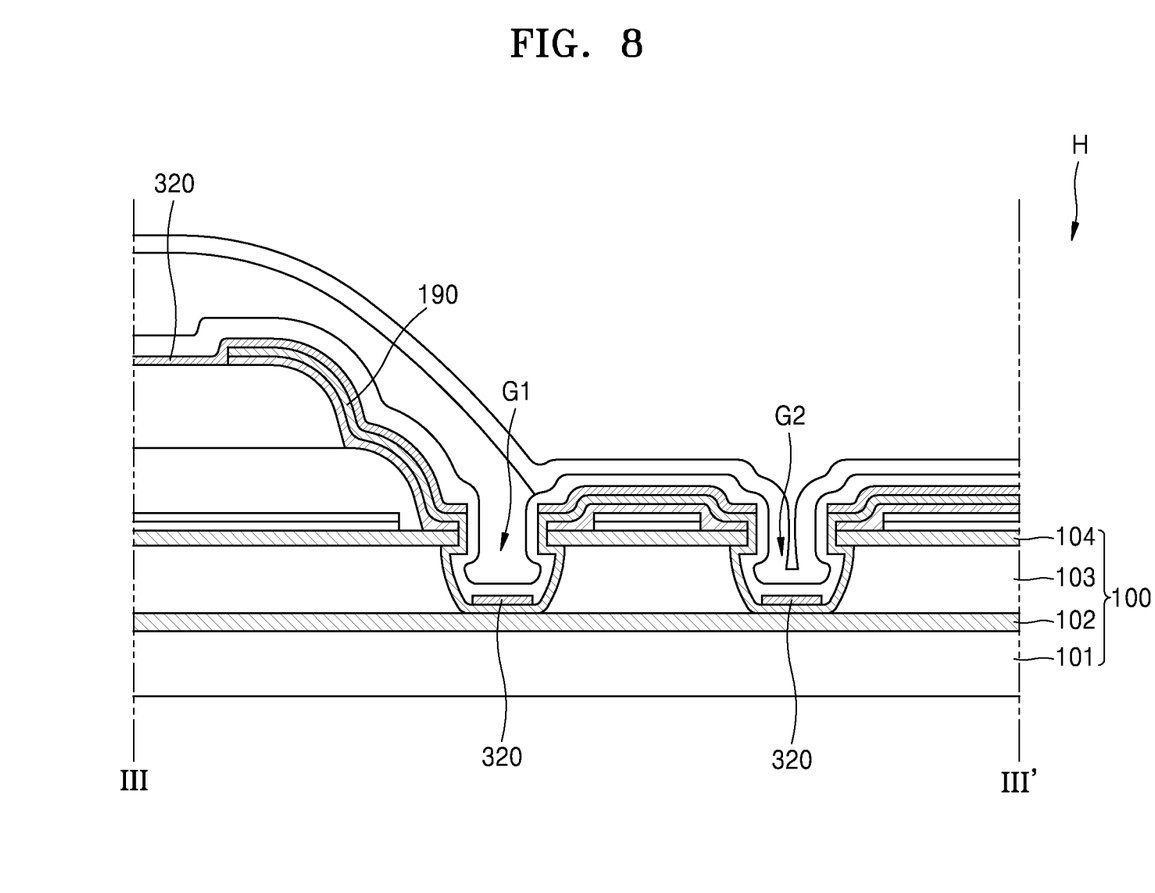
FIG. 8 is a schematic cross-sectional view of a cross-section taken along line III-III' of FIG. 4, according to another example.

FIG. 8 is a schematic cross-sectional view of a cross-section taken along line III-III' of FIG. 4, according to another example. Hereinafter, details that are described above will not be repeatedly described, and description will focus on differences from the previous embodiments.

Referring to FIG. 8, the through portion H is surrounded by the first groove G1 and the second groove G2, and the first groove G1 and the second groove G2 may be formed by entirely removing the second barrier layer 104 and the second base layer 103 of the substrate 100 which includes the first base layer 101, the first barrier layer 102, the second base layer 103, and the second barrier layer 104. In detail, the first groove G1 and the second groove G2 may have a depth equal to a sum of a thickness of the second barrier layer and a thickness of the second base layer 103. That is, the first barrier layer 102 may be exposed on the bottom of the first groove G1 and the second groove G2, and accordingly, the inorganic barrier layer 190 covering internal surfaces of the first groove G1 and the second groove G2 may directly contact the first barrier layer 102 on the bottom of the first groove G1 and the second groove G2.

Accordingly, permeation of oxygen or moisture into the display device 10 (FIG. 1) from the through portion H through the second base layer 103 may be effectively prevented. In addition, as the second barrier layer 104 is formed of an inorganic material, the inorganic barrier layer 190 may be adhered to the second barrier layer 104 with a high adhesive force, and thus, peeling of the inorganic barrier layer 190 from the second barrier layer 104 during a manufacturing process of the display device 10 (FIG. 1) or during subsequent use of the display device 10 may be effectively prevented.

According to embodiments of the present disclosure, the display device includes a through portion in which an additional member such as a camera is arranged and at least one groove surrounding the through portion, and thus, a display area displaying an image may be extended and penetration of moisture from the outside or the like through the through portion may be blocked. However, the scope of the present disclosure is not limited by the above-described effects.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display device comprising:
   a substrate comprising a display area, a first non-display area surrounding the display area, and a second non-display area surrounded by the display area;
   a through portion disposed in the second non-display area, the substrate in the through portion being removed; and
   a first groove disposed in the second non-display area in the substrate to surround the through portion,
   wherein the substrate comprises a first base layer, a first barrier layer, a second base layer and a second barrier layer that are sequentially disposed,
   the first groove extends from the second barrier layer to at least a portion of the second base layer in a depth direction of the substrate,
   the second barrier layer comprises a pair of first tips that are disposed on undercut portions formed in the second base layer in a cross-sectional view, and
   a reinforcement layer and an inorganic barrier layer are sequentially disposed on the pair of first tips.

2. The display device of claim 1, wherein the inorganic barrier layer completely covers an exposed surface of the first groove.

3. The display device of claim 2, wherein the inorganic barrier layer on the bottom of the first groove directly contacts the first barrier layer.

4. The display device of claim 2, wherein the reinforcement layer and the inorganic barrier layer are disposed in a region corresponding to the second non-display area.

5. The display device of claim 1, further comprising a second groove that is disposed between the first groove and the through portion, and surrounds the through portion,
   wherein the second barrier layer comprises a pair of second tips that are disposed on the undercut portions formed in the second base layer in a cross-sectional view, and
   the reinforcement layer and the inorganic barrier layer are sequentially disposed on the pair of second tips.

6. The display device of claim 5, wherein the inorganic barrier layer completely covers an exposed surface of the second groove.

7. The display device of claim 5, further comprising:
   a thin film transistor disposed on the substrate and a display element electrically connected to the thin film transistor in the display area; and
   an encapsulation layer disposed on the display element and extending to the second non-display area,
   wherein the encapsulation layer comprises a first inorganic encapsulation layer, an organic encapsulation layer and a second inorganic encapsulation layer that are sequentially disposed,
   the organic encapsulation layer fills the first groove, and
   the first inorganic encapsulation layer and the second inorganic encapsulation layer contact each other in the second groove.

8. The display device of claim 7, wherein the inorganic barrier layer and the first inorganic encapsulation layer contact each other in the first groove and the second groove.

9. The display device of claim 1, further comprising, in the display area, a thin film transistor that is disposed on the substrate and comprises a semiconductor layer, a gate electrode, a source electrode, and a drain electrode, and a display element electrically connected to the thin film transistor,
wherein, in the display area, a first inorganic insulating layer disposed between the semiconductor layer and the gate electrode, a second inorganic insulating layer disposed between the gate electrode and the source electrode and the drain electrode, a planarization layer disposed between the thin film transistor and the display element, and a pixel defining layer disposed on the planarization layer are disposed,
the first inorganic insulating layer, the second inorganic insulating layer, the planarization layer and the pixel defining layer extend to the second non-display area, and
ends of the first inorganic insulating layer and the second inorganic insulating layer adjacent to the first groove are covered by the planarization layer or the pixel defining layer in a first area between the display area and the first groove.

10. The display device of claim 9, wherein a blocking portion upwardly protruding from the substrate is dispose in a second area between the first groove and the second groove, and
the blocking portion comprising a first layer including a same material as the planarization layer and a second layer that is disposed on the first layer and includes a same material as the pixel defining layer.

11. A display device comprising:
a substrate comprising a display area, a first non-display area surrounding the display area, and a second non-display area surrounded by the display area, and a through portion disposed in the second non-display area, the substrate in the through portion being removed;
a first groove disposed in the second non-display area in the substrate and surrounding the through portion;
a second groove disposed between the first groove and the through portion in the substrate, and surrounding the through portion, and an inorganic barrier layer disposed on a region corresponding to the second non-display area,
wherein the substrate comprises a first base layer, a first barrier layer, a second base layer and a second barrier layer that are sequentially disposed,
the first groove and the second groove respectively extend from the second barrier layer to the second base layer in a depth direction of the substrate, and
the inorganic barrier layer completely covers an exposed surface of the first groove and an exposed surface of the second groove, and directly contacts the first barrier layer on the bottom of the first groove and the bottom of the second groove.

12. The display device of claim 11,
wherein the first groove and the second groove include undercut portions formed in the second base layer in a cross-sectional view.

13. The display device of claim 11,
wherein the second barrier layer comprises a pair of first tips that are disposed on undercut portions formed in the second base layer in a cross-sectional view and a pair of second tips that are disposed on the undercut portions formed in the second base layer in a cross-sectional view, and wherein a reinforcement layer is further disposed between the pair of first tips and the inorganic barrier layer and between the pair of second tips and the inorganic barrier layer.

14. The display device of claim 13, wherein the reinforcement layer includes at least one material selected from the group consisting of indium tin oxide (ITO), indium zinc oxide (IZO), indium zinc tin oxide (ITZO), zinc gallium oxide (GZO), and indium zinc gallium oxide (IGZO).

15. The display device of claim 13, wherein the reinforcement layer is disposed on a region corresponding to the second non-display area.

16. The display device of claim 15, wherein the inorganic barrier layer and the first inorganic encapsulation layer, and the first inorganic encapsulation layer and the second inorganic encapsulation layer directly contact each other in the second groove.

17. The display device of claim 15, wherein the inorganic barrier layer and the first inorganic encapsulation layer directly contact each other in the first groove and in the second groove.

18. The display device of claim 11, further comprising:
a thin film transistor disposed on the substrate and a display element electrically connected to the thin film transistor in the display area; and
an encapsulation layer disposed on the display element and extending to the second non-display area,
wherein the encapsulation layer comprises a first inorganic encapsulation layer, an organic encapsulation layer and a second inorganic encapsulation layer that are sequentially disposed, and
wherein the organic encapsulation layer fills the first groove.

19. The display device of claim 11,
further comprising, in the display area, a thin film transistor that is disposed on the substrate and comprises a semiconductor layer, a gate electrode, a source electrode, and a drain electrode, and a display element electrically connected to the thin film transistor,
wherein, in the display area, a first inorganic insulating layer disposed between the semiconductor layer and the gate electrode, a second inorganic insulating layer disposed between the gate electrode and the source electrode and the drain electrode, a planarization layer disposed between the thin film transistor and the display element, and a pixel defining layer disposed on the planarization layer are disposed,
the first inorganic insulating layer, the second inorganic insulating layer, the planarization layer and the pixel defining layer extend to the second non-display area, and
ends of the first inorganic insulating layer and the second inorganic insulating layer disposed adjacent to the first groove are covered by the planarization layer or the pixel defining layer in a first area between the display area and the first groove.

20. The display device of claim 19, wherein a blocking portion upwardly protruding from the substrate is disposed in a second area between the first groove and the second groove, and
the blocking portion comprising a first layer including a same material as the planarization layer and a second layer that is disposed on the first layer and includes a same material as the pixel defining layer.

* * * * *